US009274199B2

(12) United States Patent
Brey et al.

(10) Patent No.: US 9,274,199 B2
(45) Date of Patent: *Mar. 1, 2016

(54) NMR RF PROBE COIL EXHIBITING DOUBLE RESONANCE

(71) Applicants: The Florida State University Research Foundation, Inc., Tallahassee, FL (US); University of Florida Research Foundation, Incorporated, Gainesville, FL (US)

(72) Inventors: William W. Brey, Tallahassee, FL (US); Arthur S. Edison, Gainesville, FL (US); Vijaykumar Ramaswamy, Gainesville, FL (US); Jerris Hooker, Tallahassee, FL (US)

(73) Assignees: The Florida State University Research Foundation, Inc, Tallahassee, FL (US); University of Florida Research Foundation, Incorporated, Gainesville, FL (US)

( * ) Notice: Subject to any disclaimer, the term of this patent is extended or adjusted under 35 U.S.C. 154(b) by 46 days.

This patent is subject to a terminal disclaimer.

(21) Appl. No.: 14/328,204

(22) Filed: Jul. 10, 2014

(65) Prior Publication Data
US 2014/0320131 A1    Oct. 30, 2014

Related U.S. Application Data

(63) Continuation of application No. 14/069,686, filed on Nov. 1, 2013, now Pat. No. 8,779,768, which is a
(Continued)

(51) Int. Cl.
*G01V 3/00* (2006.01)
*G01R 33/62* (2006.01)
(Continued)

(52) U.S. Cl.
CPC .......... *G01R 33/62* (2013.01); *G01R 33/34023* (2013.01); *G01R 33/3635* (2013.01);
(Continued)

(58) Field of Classification Search
CPC .................. G01R 33/34023; G01R 33/34092; G01R 33/34007; G01R 33/3802; G01R 33/62; G01R 33/38; G01R 33/3635
USPC .................................................. 324/300–322
See application file for complete search history.

(56) References Cited

U.S. PATENT DOCUMENTS 4,816,765 A    3/1989 Boskamp
4,973,908 A    11/1990 Bottomley et al.
(Continued)

OTHER PUBLICATIONS

Brey et al, Design, construction, and validation of a 1-mm triple-resonance high-temperature-superconducting probe for NMR. J Magn Reson. 2006. vol. 179: 290-293.
(Continued)

*Primary Examiner* — Daniel Miller
(74) *Attorney, Agent, or Firm* — Nilay J. Choksi; Smith & Hopen, P.A.

(57) ABSTRACT

NMR probe coils designed to operate at two different frequencies, producing a strong and homogenous magnetic field at both the frequencies. This single coil, placed close to the sample, provides a method to optimize the NMR detection sensitivity of two different channels. In addition, the present invention describes a coil that generates a magnetic field that is parallel to the substrate of the coil as opposed to perpendicular as seen in the prior art. The present invention isolates coils from each other even when placed in close proximity to each other. A method to reduce the presence of electric field within the sample region is also considered. Further, the invention describes a method to adjust the radio-frequency tuning and coupling of the NMR probe coils.

12 Claims, 6 Drawing Sheets

Related U.S. Application Data continuation-in-part of application No. 13/916,231, filed on Jun. 12, 2013, now abandoned.

(60) Provisional application No. 61/658,706, filed on Jun. 12, 2012.

(51) Int. Cl.
    *G01R 33/38*     (2006.01)
    *G01R 33/34*     (2006.01)
    *G01R 33/36*     (2006.01)
    *G01R 33/422*     (2006.01)

(52) U.S. Cl.
    CPC ............ *G01R33/38* (2013.01); *G01R 33/3802* (2013.01); *G01R 33/34061* (2013.01); *G01R 33/365* (2013.01); *G01R 33/3628* (2013.01); *G01R 33/422* (2013.01); *Y10T 29/4913* (2015.01); *Y10T 29/49155* (2015.01)

(56) References Cited

U.S. PATENT DOCUMENTS

| | | | | |
|---|---|---|---|---|
| 5,276,398 | A * | 1/1994 | Withers et al. | 324/318 |
| 5,565,778 | A | 10/1996 | Brey et al. | |
| 5,594,342 | A | 1/1997 | Brey et al. | |
| 6,201,392 | B1 * | 3/2001 | Anderson et al. | 324/300 |
| 7,375,525 | B2 * | 5/2008 | Laubacher et al. | 324/318 |
| 7,397,246 | B2 | 7/2008 | Freytag et al. | |
| 7,446,534 | B2 | 11/2008 | Withers | |
| 8,089,281 | B2 | 1/2012 | Zhai et al. | |
| 8,779,768 | B2 * | 7/2014 | Brey et al. | 324/307 |
| 2002/0190715 | A1 * | 12/2002 | Marek | 324/318 |

OTHER PUBLICATIONS

Brey et al. Design, construction and validation of a High-Temperature-Superconducting 13C optimized 1.5-mm cryogenically cooled NMR probe for natural products and metabolomics. In the 53rd Experimental NMR Conference. Miami, FL. 2012.

* cited by examiner

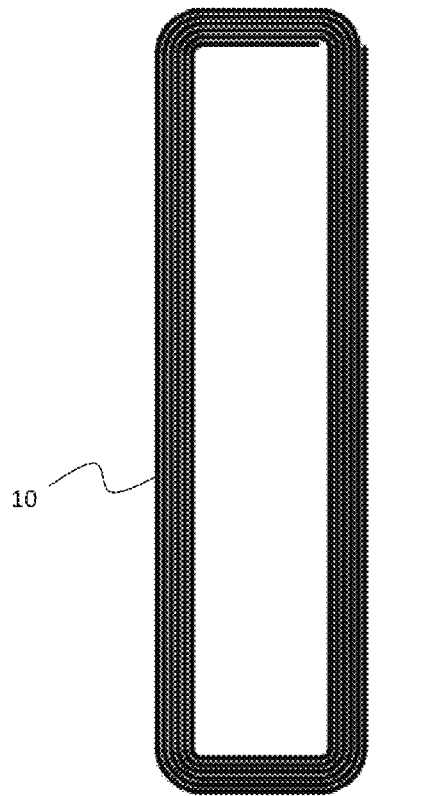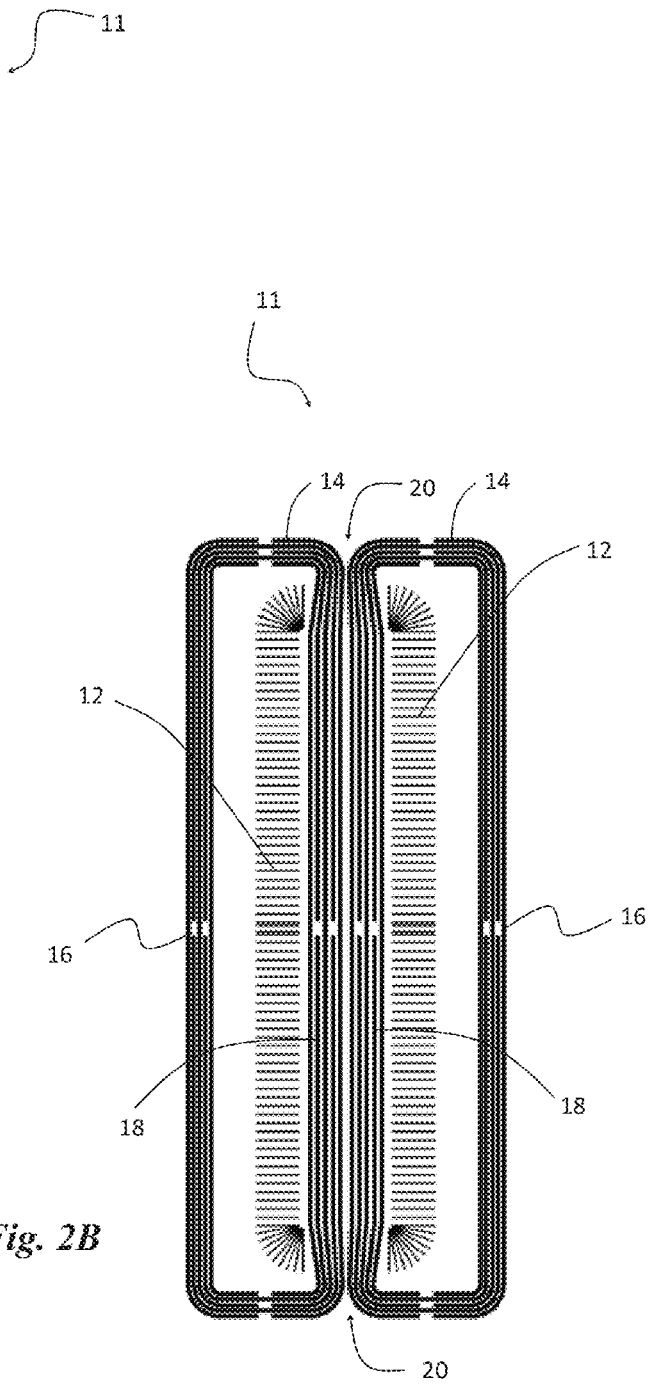
Fig. 2A
Fig. 2B 1H, 13C sample 15N, 2H

NMR RF PROBE COIL EXHIBITING DOUBLE RESONANCE

CROSS-REFERENCE TO RELATED APPLICATIONS

This nonprovisional application is a continuation of and claims priority to U.S. nonprovisional application Ser. No. 14/069,686, entitled "NMR RF Probe Coil Exhibiting Double Resonance", filed Nov. 1, 2013, now U.S. Pat. No. 8,779,768, which is a continuation-in-part of and claims priority to U.S. nonprovisional application Ser. No. 13/916,231, entitled "NMR RF Probe Coil Exhibiting Double Resonance", filed Jun. 12, 2013, which claims priority to provisional application No. 61/658,706, entitled "NMR RE Probe Coil Exhibiting Double Resonance", filed Jun. 12, 2012, all of which are incorporated herein by reference in their entireties.

FEDERALLY SPONSORED RESEARCH OR DEVELOPMENT

This invention was made with Government support under Grant No. 1R01EB009772-01 awarded by National Institute of Health. The government has certain rights in the invention.

BACKGROUND OF THE INVENTION

1. Field of the Invention

This invention relates, generally, to nuclear magnetic resonance (NMR). More specifically, it relates to radiofrequency (RF) transmit-receive coils.

2. Brief Description of the Related Art

Nearly 50% of all the prescription drugs that are in use today were derived from naturally occurring chemicals, also called natural products. In order to identify natural products, they must be fully characterized using spectroscopy techniques such as nuclear magnetic resonance (NMR). NMR is unique in its ability to provide precise information about molecular structure and dynamics. Though NMR is quite powerful, its low sensitivity, however, is a major bottleneck in natural product discovery.

To gain maximum sensitivity, NMR spectrometers are designed to operate at high magnetic field strengths, and consequently the spectrum of NMR signals is in the radio frequency range. The transmit/receive coils are the probe coils that stimulate the nuclei and detect the NMR response from the sample. The sensitivity of the probe coils is primarily dependent on two factors the quality factor (Q-factor) of the coil and the filling factor of the coil. The Q-factor can be improved by constructing the coil out of low loss/resistance materials, such as high temperature superconducting (HTS) materials (Brey, W. W., Edison, A. S., Nast, R. E., Rocca, J. R., Saha, S., and Withers, R. S. (2006) Design, construction, and validation of a 1-mm triple-resonance high-temperature-superconducting probe for NMR, *J Magn Reson* 179, 290-293; Brey, W. W., Edison, A. S., Hooker, J., Nast, R. E., Ramaswamy, V., and Withers, R. S. (2012) Design, construction and validation of a High-Temperature-Superconducting 13 C optimized 1.5-mm cryogenically cooled NMR probe for natural products and metabolomics, In *The 53rd Experimental NMR Conference*, Miami, Fla.).

The filling factor can be improved by placing the coil very close to the sample. In multi-channel NMR probes, therefore, the sensitivity of each channel decreases as the distance between coils and the sample increases. Thus, the sensitivity of the probes can be optimized at an inefficient rate of only one channel at a time, namely, the coil placed closest to the sample. Furthermore, another drawback of the probes and methodology of the prior art is that the placement of coils in very close proximity to each other causes undesirable interaction between them.

Another factor affecting sensitivity, aside from materials used (e.g., HTS) and proximity to the sample, is the size of the coil size. Smaller coil sizes tend to lead to more insensitive coils.

An NMR probe coil provides the radiofrequency (RF) magnetic field to the sample, thereby stimulating the nuclear spins, and detects the response of the nuclear spins. When RF current flows through the windings of the NMR probe coil, an RF magnetic field is produced perpendicular to the direction of the current. An RF transmit current forced into the coil produces an RF magnetic field in the sample region, which excites the nuclear spins. Conversely, the RF magnetic field caused by the precession motion of the nuclear spins induces an RF current in the coil windings. In the transmit mode, the strength of the magnetic field decays away with an increase in the distance from the coil, as determined by the Biot-Savart law. By reciprocity, in the receive mode, the strength of the induced current in the coil decays as the distance between sample and coil increases. Under these conditions, it is desirable to design the NMR probe coils to be placed as close as possible to the sample for purposes of optimizing sensitivity.

Another important factor affecting the performance of the RF probe coils is the Q-factor of the coil. The Q-factor can be improved by lowering the resistance and thus the loss in the material of the coil. This may be achieved by either lowering the temperature of the normal metal coils, or by using superconducting material. NMR probe coils are commonly fashioned out of HTS materials. This is achieved by patterning the HTS on planar dielectric substrates. However, such planar coils offer significant constraints to placing the coils very close to the sample.

For NMR excitation and detection of multiple channels, conventional RF probes utilize one (1) pair of coils for each channel. The pair of coils that is placed closest to the sample performs at its optimum to achieve excellent sensitivity. Each additional channel requires a pair of coils nested outside all the other channels. As channels are added, each additional pair of coils must be placed farther away from the sample, providing lower and lower sensitivity. An NMR field frequency lock channel typically used for analytical NMR requires its own coil pair in addition to the others. A typical "triple resonance" NMR probe of the type commonly used for biomolecular structure experiments requires a total of four (4) nested pairs of coils, and of these, only the inner pair is optimized for sensitivity since it is closest to the sample.

The prior art has attempted to improve upon NMR RF probe coils. For example, U.S. Pat. No. 4,973,908 relates to a surface coil for NMR spectroscopy of humans which utilizes a circular coil and a figure-8 or butterfly coil that is produces a magnetic field substantially perpendicular to the circular coil. The '908 patent applies to a surface coil rather than a volume coil, applies to human rather than analytical NMR spectroscopy, is fabricated from freestanding metal rather than deposited on a dielectric substrate, and relies on discrete rather than distributed and integrated capacitive elements to tune to the NMR frequency.

U.S. Pat. No. 4,816,765 describes a surface coil for MRI of human which utilizes coplanar coils of different shapes to generate orthogonal magnetic fields. The coils are intended for quadrature MRI applications.

U.S. Pat. No. 5,565,778 discloses a self-resonant structure known as a "racetrack" which incorporates interdigital capacitors into the NMR coil.

U.S. Pat. No. 5,594,342 describes dividing the current carrying elements into thin strips to avoid distortion of the NMR polarizing field.

U.S. Pat. No. 6,201,392 describes to a number of configurations of parallel superconductive coils to minimize interaction between coils. Simple rectangular coils are partly overlapped or otherwise disposed to null their mutual inductance. A parallel LC trap can be incorporated into the rectangular coil to reduce interaction with other coils at a single frequency. However, this prior art does not teach orthogonal magnetic fields as a means to null the mutual inductance between the coils. Rather, it teaches parallel magnetic fields over the sample region. Parallel magnetic fields have several drawbacks, however. For example, coil independence can be achieved only by requiring adjustment of overlap of coils on a single substrate and/or adjustment of the spacing of coils on independent substrates. Further, the '392 patent does not teach the use of fixed coupling loops which utilize variable capacitors to adjust tuning and matching.

U.S. Pat. No. 7,397,246 relates to methods for combining superconductive and low-Q coils such that the low-Q coils do not spoil the Q of the superconductive coils. The methods involve crossovers in the low-Q coils to reduce capacitive coupling to the superconductive coils.

U.S. Pat. No. 7,446,534 discloses a method to suppress the electric field of the NMR coil fringing into the sample.

U.S. Pat. No. 8,089,281 relates to doubly resonant surface coils with the magnetic fields substantially orthogonal to each other.

However, the foregoing prior art suffers from the one or more of the following disadvantages, despite the increased sensitivity seen in probes formed of HTS materials. Conventional probe coils have been unable to replace the industry standard 5-mm triple resonance probe used in laboratories. Probes that are newly developed tend to be niche probes that are capable of use in very specific applications. Additionally, there are moving elements with HTS probes that are not used in probes based on metal wires. These moveable wire loops adversely affect static magnetic field homogeneity, which makes initial adjustment difficult and reduces the resolution that can be obtained. The loops also can fail and are difficult to repair. Further, patterning multiple coils close to each other causes interference that can affect the reproducibility of results.

In a conventional NMR probe, metal wire or foil loops surrounding the sample convert a tiny RF magnetic field from the sample into electrical signals which are detected by the spectrometer. The conversion is not an efficient process because of the resistance of the metal. In an HTS probe, self-resonant coils are formed of thin-film oxide superconductors, such as yttrium barium copper oxide (YBCO), instead of metal. This is used as NMR detection coils because of their extremely high quality factors and nearly loss-free qualities in the NMR frequency range. The film is available as a coating on polished sapphire wafers. Electrical energy is coupled into and out of these coils by means of inductive coupling to a wire loop at the end of a coaxial transmission line. Mechanical adjustment of the position of the wire loop is used to adjust the coupling to match the coil impedance to the characteristic impedance of the transmission line. A related adjustment of radio frequency properties is known as tuning. Tuning refers to a shift in resonant frequency of the NMR coil. In HTS, this shift is accomplished by moving a shorted wire loop so that it intercepts a variable amount of flux from the NMR coil.

The moving loop approach for tuning and matching has some important disadvantages. Most importantly, moving a loop and coaxial cable close to the NMR sample tends to change the uniformity of the polarizing magnetic field. In NMR, chemical resolution is typically limited by the uniformity of the polarizing field. Great effort is made to adjust this uniformity in a process called "shimming." Even if the loop is made from high quality susceptibility-compensated wire, the effect is noticeable. It is, therefore, not possible to adjust the RF coupling (known as matching) or the tuning without affecting the resolution, requiring a time-consuming step of re-shimming the magnet.

Another drawback of moving loops is basic to the use of moving parts in almost any device. Moving parts tend to be less reliable than other approaches, as there is higher chance of inefficiencies and failure.

Additionally, the number of nested pairs required for a triple resonance NMR probe places a limit on the sample diameter that can practically be accommodated. To achieve reasonable sensitivity and field homogeneity, each coil pair must be at least as wide as the gap between the coils. Within a "standard bore" NMR magnet, shim and pulsed field gradient coil, there is not enough room to nest more than about three (3) channels around a standard 5-mm diameter sample tube. There is very little space available in NMR probes, and the need for independent loops for the two functions makes the design, construction, adjustment and repair of HTS NMR probes significantly more difficult and time consuming. There is insufficient space to accommodate the coils required for a triple resonance probe that requires four (4) channels and four (4) nested pairs.

Accordingly, what is needed is an NMR probe that has multiple RF coils in close proximity with each other and with the sample, while producing a strong and homogenous magnetic field at both frequencies that reduces electric fields within the sample region and while also minimizing the interaction between the RF coils. With HTS materials, fewer superconducting materials should be needed, thus allowing for a larger, standard-sized sample, while eliminating moving parts, in turn improving reliability and reproducibility of results. However, in view of the art considered as a whole at the time the present invention was made, it was not obvious to those of ordinary skill in the field of this invention how the shortcomings of the prior art could be overcome.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of the invention, applicants in no way disclaim these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

The long-standing but heretofore unfulfilled need for a single coil NMR probe that can operate at two frequencies, while producing a strong and homogenous magnetic field at both frequencies that reduces electric fields within the sample region is now met by a new, useful, and nonobvious invention.

In an embodiment, the current invention is an NMR probe. The NMR probe includes a first RF coil and a second RF coil patterned on a dielectric substrate, and a pair of such dielectric substrates with a sample region therebetween configured to receive an NMR sample. The first and second RF coils are patterned on a single dielectric substrate, are formed of conductive materials, and generate magnetic fields that are each resonant with an operating frequency that may be the same or different. The magnetic fields of the first and second RF coils are orthogonal to each other at their respective operating frequencies in the sample region. With this structure and configuration, these magnetic fields excite and detect their respective NMR signals at their operating frequencies simultaneously.

The first and second RF coils can each include a set of current-carrying elements that are exclusive of each other at their respective radiofrequencies/operating frequencies. Alternatively, the current-carrying elements can be the same, such that resonances are produced from the current-carrying elements by differences in current density distribution at the operating frequencies.

Structurally, the RF coils can be configured in a variety of manners. The RF coils can be patterned on opposite sides of a single dielectric substrate. Optionally, a Faraday shield may be positioned between the radiofrequency coils, where said Faraday shield would shield the electric field generated by said second coil distal to the sample, but would not affect the magnetic field generated by said first RF coil proximal to the sample. Further, the first and second RF coils can be a spiral coil and a figure-8 racetrack resonator, respectively. In this embodiment, the spiral coil may generate its magnetic field substantially perpendicular to the plane of the dielectric substrate, and the figure-8 racetrack resonator may generate its magnetic field substantially parallel to the plane of the dielectric substrate. Here, the figure-8 racetrack resonator coils on either side of the sample may carry current in counter directions so that the generated magnetic fields are additive and parallel to the plane of the dielectric substrate.

Alternatively, the configuration can be such that the dielectric substrate is formed of multiple substrates that are fastened together. In this case, the RF coils would be patterned on the two different dielectric substrates.

Alternatively, the configuration can be such that the RF coils are patterned on the same side of the dielectric substrate in a manner that one RF coil is patterned within the other RF coil. Here, the first and second RE coils can be a spiral coil and a racetrack resonator, respectively, with the racetrack resonator positioned within the spiral coil. In this embodiment, the spiral coil may generate its magnetic field substantially perpendicular to the plane of the dielectric substrate, and the racetrack resonator may generate its magnetic field substantially parallel to the plane of the dielectric substrate.

The NMR probe may further include capacitive coupling between current-carrying elements of each RF coil across the dielectric substrate at either or both of the operating frequencies.

The NMR probe may further include inventive RF coils in the shape of a figure-8. The current in the probe at the operating frequencies would flow through the central conductor of the figure-8, such that the magnetic fields generated by the coils would be substantially parallel to the plane of the dielectric substrate. Further, the central conductor can have ends that are tapered (i.e., wider in the middle than at the ends) in order to improve homogeneity of the magnetic fields.

The NMR probe may further include a fixed inductive coupling loop for transferring energy into and out of the RF coils. The coupling loops would be terminated by a network of capacitors that are adjustable to achieve tuning and coupling of the RF coils. The coupling loops may be formed of non-superconductive metallic conductors (i.e., normal metallic conductors) or high temperature superconductors, among other suitable materials.

In a separate embodiment, the current invention is an NMR probe. The NMR probe includes a pair of dielectric substrates each comprising a spiral coil and a figure-8 racetrack coil, a sample region therebetween configured to receive an NMR sample, capacitive coupling between the current-carrying elements of the coils, and a fixed inductive coupling loop. The RF coils are patterned on a single dielectric substrate, are formed of conductive materials, and generate magnetic fields that are each resonant with an operating frequency that may be the same or different. The magnetic fields of the RF coils are orthogonal to each other at their respective operating frequencies in the sample region. The current-carrying elements of the coils are exclusive of each other at their respective radiofrequencies/operating frequencies. Structurally, the spiral coil is patterned on one side of the dielectric substrate, and the figure-8 racetrack resonator is patterned on the opposite side of the dielectric substrate. The figure-8 racetrack coils on either side of the sample carry current in counter directions so that the generated magnetic fields are additive and parallel to the plane of the dielectric substrate. A Faraday shield is positioned between the spiral RF coils, where said Faraday shield would shield the electric field generated by the spiral coil distal to the sample, but not affect the magnetic field generated by said racetrack coil proximal to the sample. As discussed, the NMR probe includes capacitive coupling between current-carrying elements of each RF coil across the dielectric substrate at either or both of the operating frequencies. The figure-8 racetrack coil comprises a central conductor patterned along the longitudinal axes of the RF coils. The current in the figure-8 coil at the operating frequencies would flow through the central conductor, such that the magnetic fields generated by the coils would be substantially parallel to the plane of the dielectric substrate. Further, the central conductor can have ends that are tapered (i.e., wider in the middle than at the ends) in order to improve homogeneity of the magnetic fields. The fixed inductive coupling loop is formed of high temperature superconductors and transfers energy into and out of the RF The coupling loops would be terminated by a network of capacitors that are adjustable to achieve tuning and coupling of the RF coils. With this structure and configuration, these magnetic fields excite and detect their respective NMR signals at their operating frequencies simultaneously.

In a separate embodiment, the current invention is a method of minimizing interaction between two (2) coils positioned in close proximity to each other. The two coils are patterned on a single dielectric substrate, and each generates its own magnetic field resonant at an operating frequency. The coils are positioned such that the magnetic fields are orthogonal to each other at their respective operating frequencies. With this methodology, the net magnetic flux generated by one coil and flowing through the other coil would be zero (0).

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which:

FIG. 2A is a rear view of a $^{13}$C-$^{1}$H coil according to an embodiment of the current invention.

FIG. 2B is a front view of the $^{13}$C-$^{1}$H coil of FIG. 2A.

DETAILED DESCRIPTION OF THE PREFERRED EMBODIMENT

Figure 1A:
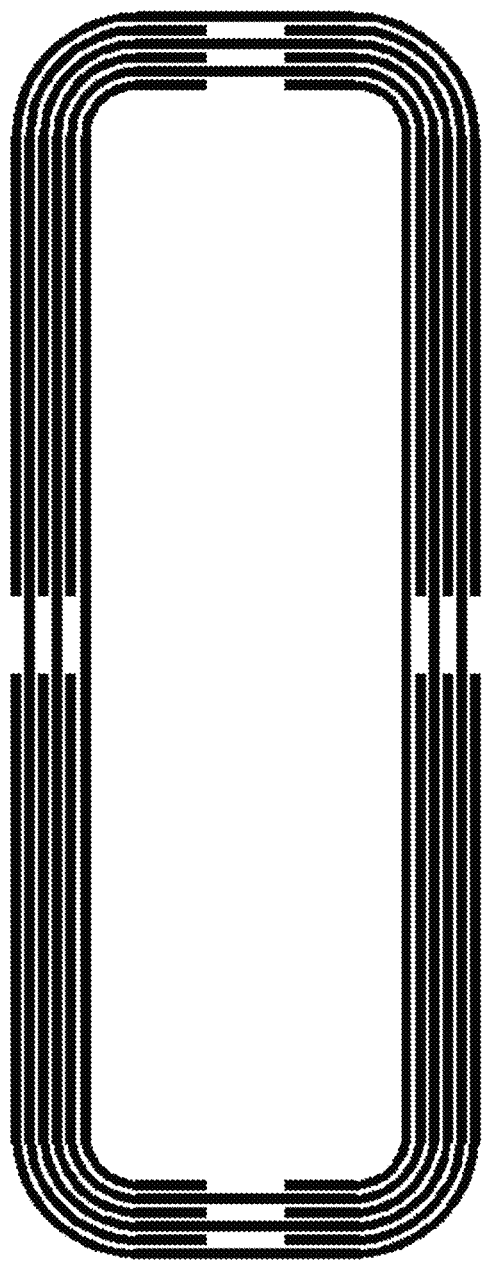
FIG. 1A is a perspective view of a coil according the prior art.

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

In an embodiment, the current invention is an NMR RF probe coil that includes two NMR sample coils on a single substrate to allow better sensitivity for the second channel. Each RF coil is formed of conductive material patterned on a single dielectric substrate. The two sets of coils thrm a sample region between them for positioning the NMR sample. The coils can be used in existing NMR RF probes. These probes are used for chemical identification and structural analysis of molecules.

Using this NMR RF probe coil, two NMR coils can be placed in proximity to the NMR sample instead of one as in the conventional art. In an embodiment, the NMR RF probe coil includes superconductive oxide coils patterned on a flat dielectric substrate. Sensitivity and other performance aspects are improved for the second coil, which can be used for a second nuclear isotope. For example, the two nuclear isotopes can be and $^{13}$C analyzed simultaneously. The novel arrangement and coil structures produce a uniform magnetic field over the sample space and resonate at the required radiofrequencies.

The probe coil is structured reduces the space required for the coils, allowing for larger samples in standard NMR magnets. This structure would permit function of a standard 4-resonance probe ($^{1}$H, $^{13}$C, $^{2}$H, $^{15}$N) for a standard 5-mm diameter sample tube in a standard diameter magnet. Contrastingly, the conventional art has taught that high sensitivity superconductive probes are limited to smaller samples or fewer channels. With two coils on a single substrate, the number of coils in each probe is reduced by 50%, reducing complexity and cost.

In a contemplated arrangement of the probe coil, each coil set at one of the two resonance frequencies are exclusive of the current-carrying elements at the other frequency. The coils can be placed on the dielectric substrate in a variety of configurations. One configuration includes the coils placed on opposite sides of one dielectric substrate. Another configuration includes the coils patterned on two separate dielectric substrates that are fastened together. Another configuration includes the coils placed on the same side of one dielectric substrate, where one coil is placed within the other coil.

In an alternative arrangement of the probe coil, the current-carrying elements are not exclusive of each other at the two resonance frequencies. Capacitive coupling can be achieved between the two coils across the substrate at one or both of the two frequencies.

In an alternative arrangement of the probe coil, the NMR probe can comprise the current-carrying elements of each coil set at two frequencies that are the same. Two resonances can then be produced due to differences in the distribution of current density at the two frequencies.

In certain embodiments, the current invention further contemplates a method of using two RF coils in close proximity to one another with very little interaction. The two coils are positioned such that the net magnetic flux generated by one coil and flowing through the other coil is zero (0). As a result of this structure and positioning, the magnetic field produced by one coil at its operating frequency is orthogonal to the magnetic field produced by the other coil. The NMR probe coil includes conductive elements patterned on a dielectric substrate for a resonant device. The current in the coil at the resonance frequency flows through a central conductor, and flows back in the reverse direction through distal conductors. This creates a magnetic field within a sample region that is parallel to the dielectric substrate.

The central conductor may be wide near the middle of its structure and tapered along the ends along the longitudinal axis of the coil. This structure can help improve the homogeneity of the magnetic field of the NMR probe coil.

A single fixed loop can be used to couple electrical energy into and out of the HTS NMR coils. The loop is terminated by a network of trimmer capacitors that are adjusted to vary both the coupling and the resonant frequency of the NMR coil. This single fixed loop replaces two loops used in the prior art.

In order to allow for adjustments to tuning and matching, the single loop is in an over coupled condition to the NMR coil. This means that the impedance at the loop terminals looking toward the coil at the coil resonance frequency is less than the characteristic impedance of the transmission line. The amount of coupling needed can be predetermined and preset based on the inductance and quality factor of the NMR coil, the tuning range needed, and the anticipated loss in the NMR sample itself.

Further, electrical loss should be minimized in the fixed coupling loop. This electrical loss can occur as a function of two processes. First, there may be electrical loss due to the desired currents induced along the length of the coupling loop needed for coupling and tuning. These loops increase proportionally with the series resistance of the wire. In the typical limit for RF circuits, where the wire thickness is much greater than the skin depth, the series resistance varies inversely with the wire radius. This transport loss is then inversely proportional to wire radius, so it would be desirable to use a wire of large radius. However, magnetic flux perpendicular to the finite surface area of the wire induces so-called eddy currents in the wire, also contributing to electrical loss. A wire of larger radius would be subject to greater eddy current loss. As such, there is an optimal wire radius which can be determined for each case. The location and shape of the fixed coupling loop can also be adjusted to maximize coupling while minimizing eddy current loss. Because the loop is fixed, the wire would remain in the configuration of minimum loss at all times.

In certain embodiments, the current invention teaches doubly resonant coils that generate strong and homogenous magnetic field at two resonance frequencies. The current distribution in these two resonance modes is such that the magnetic fields within the sample region are orthogonal to each other. In an embodiment, a set of two coils whose magnetic fields are orthogonal to each other within the sample region is used to excite and detect the two resonance frequencies, thereby allowing for independent design optimization with almost negligible interaction between the two coils. In another embodiment, quadrature detection of NMR signal at one frequency may be achieved by positioning two coils that operate at the same frequency.

Figure 1B:
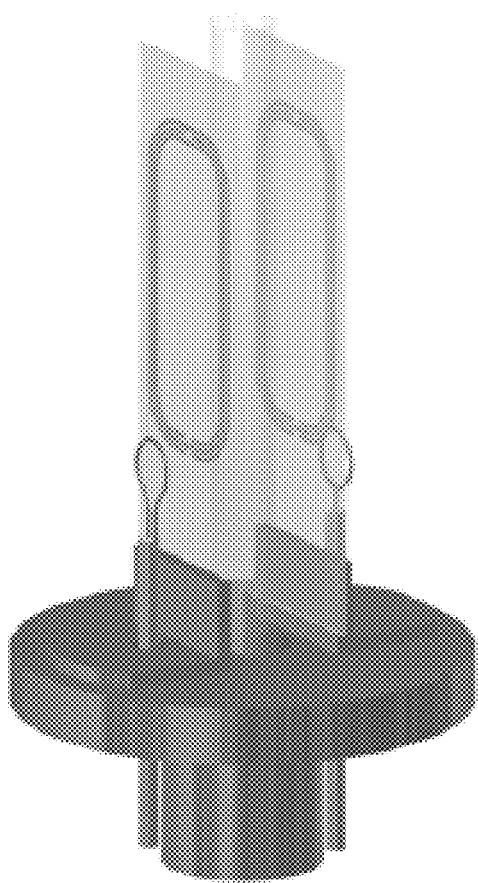
FIG. 1B is a perspective view of a single channel HTS probe according to the prior art
Figure 1C:
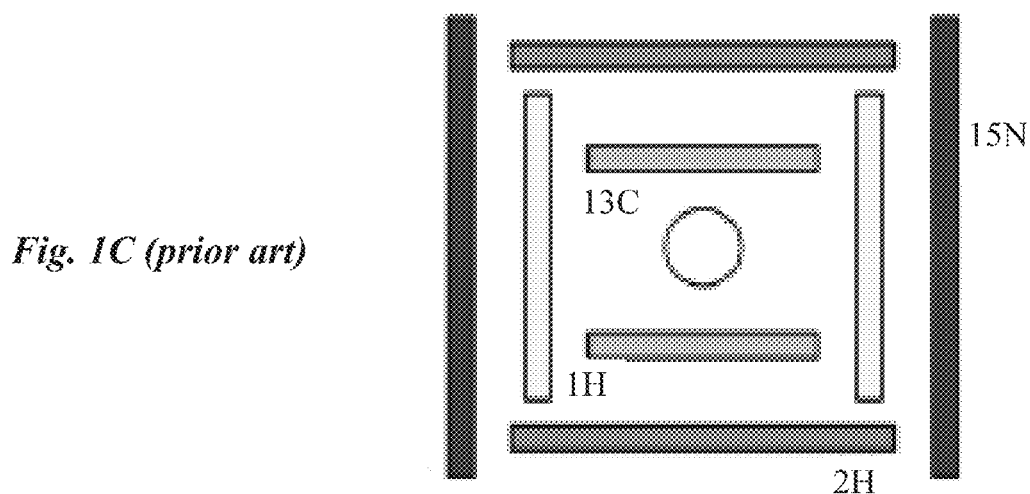
FIG. 1C is a cross-sectional layout of a 4-channel probe showing four (4) pairs of conventional HTS coils, according to the prior art.

Conventional NMR probe coils, such as those seen in FIGS. 1A-1C known in the prior art and operating at their fundamental resonance frequency, generate a magnetic field perpendicular to the substrate of the coil. The pair of coils straddling the sample on either side forms a Helmholtz pair, and the magnetic field homogeneity is determined by the Helmholtz condition. FIG. 1B illustrates the arrangement of a single channel HTS probe: a pair of self-resonant HTS coils mounted on a coldhead, an inductive loop for coupling the RF energy from the coil, and another loop for frequency fine-tuning. Each additional channel requires the use of another set of coils and loops. The most useful configuration of NMR probe is known as 'triple resonance' because it includes channels for three of the most biologically significant elements: hydrogen, carbon and nitrogen. A fourth channel (deuterium) is included to regulate the magnetic field. An HTS probe of this nature requires the use of four pairs of coils as shown in FIG. 1C, along with the associated tuning and coupling loops.

Figure 2C:
FIG. 2C is a cross-sectional layout of a 4-channel probe using double-resonance HTS coils according to the current invention. It can be seen that the number of elements in the probe can be cut in half with the use of double-resonance coils.
Figure 2C:
Figure 2C:
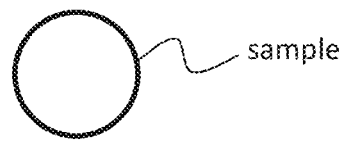
Figure 2C:
Figure 2C:

Contrastingly, the current invention is a double-resonance probe coil that produces a strong and homogenous magnetic field at two frequencies simultaneously. The double-resonance coils provide optimum NMR detection sensitivity of both carbon and hydrogen as shown in FIG. 2C. They are superior to single-resonance designs because they allow ideal sensitivity of two channels simultaneously. Also, they reduce the expense and the complexity by reducing the number of coil pairs required.

In an embodiment, the present invention is an NMR coil that generates a magnetic field parallel to the substrate of the coil. The pair of coils on either side of the sample carries currents in counter directions, in order that the magnetic fields from both coils are additive. The homogeneity of the magnetic field can be optimized by adjusting the width and shape of the central conducting strip.

The presence of electric field within the sample region can be a source of loss in NMR experiments. In the design of NMR probes, it may be desirable that the coils have the lowest possible electric field in the sample region, so as to achieve high sensitivity. Various means of reducing the electric field are known in the art. In an embodiment of the invention, the coil used to generate the magnetic field at one of the frequencies can be used as a mechanism to shield the electric field at the other frequency. In a further embodiment, dedicated electric field shields are used to reduce the electric field penetrating the sample region.

It will be appreciated by those skilled in the art that a number of variations are possible within the spirit and scope of the invention. The scope of the invention should not be limited by the specific examples given, but by the appended claims.

Example 1

FIGS. 2A and 2B illustrate an embodiment of the current invention, a $^{13}$C-$^1$H coil generally denoted by the reference numeral 11, where coil structures 10, 14 are placed on opposite sides of one dielectric substrate. Exemplary coil 11 would be appropriate to use as the inner coil pair in an NMR probe designed for detection of both $^{13}$C and $^1$H isotopes. In this embodiment, a dielectric substrate (not shown) separates two superconductive films patterned into self-resonant coil structures 10, 14. Two such films are disposed around a cylindrical sample as in the prior art to produce a uniform RF magnetic field across the sample. The long axis of coil 11 would be oriented along the field axis of the solenoidal NMR magnet.

The aspect of coil 11 distal to the sample can be seen in FIG. 2A and is patterned into spiral coil structure 10. Spiral coil structure 10 produces a field that is substantially perpendicular to the plane of the dielectric substrate. Spiral coil structure 10 is well suited to achieving low resonance frequencies associated with $^{11}$C, $^{15}$N and other nuclei, excluding $^1$H and $^{19}$F. However, the electric field of spiral coil structure 10 fringes away from the dielectric substrate and into the sample under analysis. The conductivity and dielectric loss of the sample are often enough to reduce the Q-factor of the coil and to contribute to the noise of the NMR measurement.

Thus, to improve sensitivity on the $^{13}$C channel, coil 11 includes Faraday shield 12 on the aspect of coil 11 proximal to the sample as described in U.S. Pat. No. 7,446,534, which is incorporated herein by reference. Shield 12 includes thin, closely spaced wires that do not greatly affect the magnetic field produced by spiral coil structure 10. The high frequency (typically $^1$H) resonator is patterned on the "front" side of each dielectric substrate, facing the sample, as seen in FIG. 2B.

The building block for the $^1$H coil is the "racetrack" resonator as described in U.S. Pat. No. 5,565,778, which is incorporated herein by reference. Two racetrack resonators 14 are patterned adjacent to each other. The resulting structure resembles the figure-8 coil described in U.S. Pat. No. 4,973, 908, which also is incorporated herein by reference. Racetrack resonators 14 produce an RF magnetic field that is substantially parallel to the dielectric substrate and orthogonal to the electric field produced by spiral coil structure 10 on the rear side of the substrate.

Racetrack resonator 14 can be readily tuned to the higher frequency of the $^1$H isotope. When broken with several gaps 16, in this case with four (4) gaps, racetrack resonator 14 has a low fringing electric field and is suitable for use close to a biomolecular sample. Both spiral coil structure 10 and racetrack resonator 14 should be patterned into thin parallel wires as taught in U.S. Pat. No. 5,565,778 patent to reduce distortions of the polarizing magnetic field. Therefore, in areas where spiral coil structure 10 and gaps 16 overlap, where it is not possible to continue Faraday shield 12, racetrack resonator 14 itself serves as a Faraday shield for spiral coil structure 10 and does not greatly affect the magnetic field of spiral coil structure 10.

In NMR spectroscopy, it is important to produce a uniform RE magnetic field over the sample. The field of the figure-8 coil formed by adjacent racetrack resonators 14 is not as uniform, in general, as that of the pair of rectangular resonators. However, the uniformity can be improved by widening the central region of center portion 18 of the figure-8 coil. It may be advantageous for RE homogeneity to taper center portion 18 at the ends as shown in FIG. 2B.

Example 2

Figure 3:
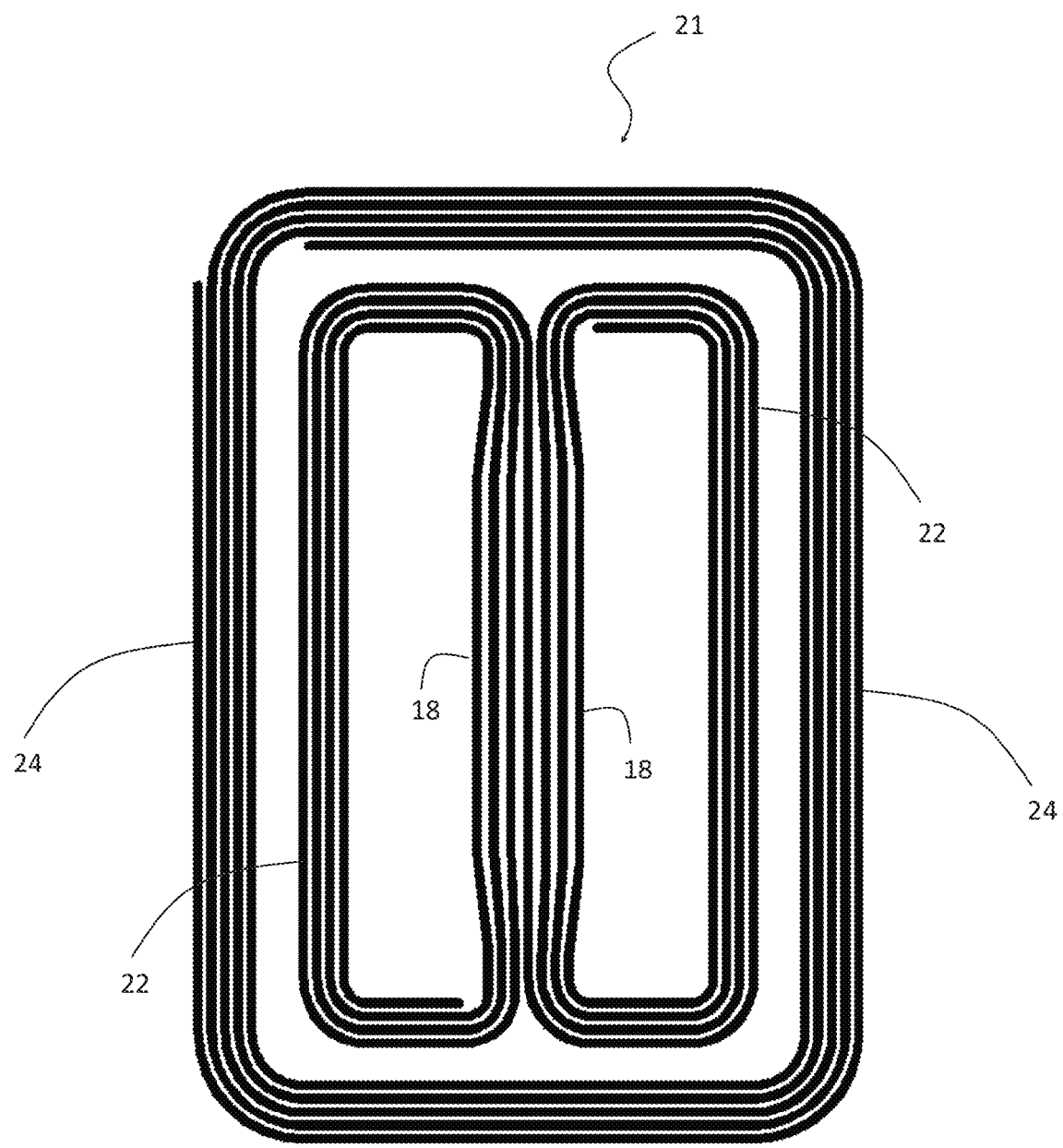
FIG. 3 depicts a $^{15}$N-$^{2}$H coil according to an embodiment of the current invention.

FIG. 3 illustrates another embodiment of the current invention, a $^{15}N$-$^{2}H$ coil generally denoted by the reference numeral 21, where the coil structures 22, 24 are positioned on the same side of one dielectric substrate and one coil is placed within the other coil. Exemplary coil 21 would be appropriate to use as the outer coil pair in an NMR probe designed for decoupling on the $^{15}N$ channel and for engaging a $^{2}H$ field frequency lock. In this embodiment, both self-resonant coil structures 22, 24 are patterned on the same side of the dielectric substrate, thereby eliminating the two-sided patterning of the HTS coils.

The longitudinal axis of coil 21 would be oriented along the field axis of the solenoidal NMR magnet. Coil 21 includes figure-8 coil structure 22 tuned to the $^{2}H$ frequency and spiral coil structure 24 tuned to the $^{15}N$ frequency. The magnetic field in the sample region at the spiral coil structure resonance frequency is substantially perpendicular to the dielectric substrate, whereas the magnetic field in the sample region at the resonance frequency of coil structure 22 is substantially parallel to the dielectric substrate. The central region of the center portion 18 of figure-8 coil structure 22 is widened to provide better RF homogeneity.

Figure 4:
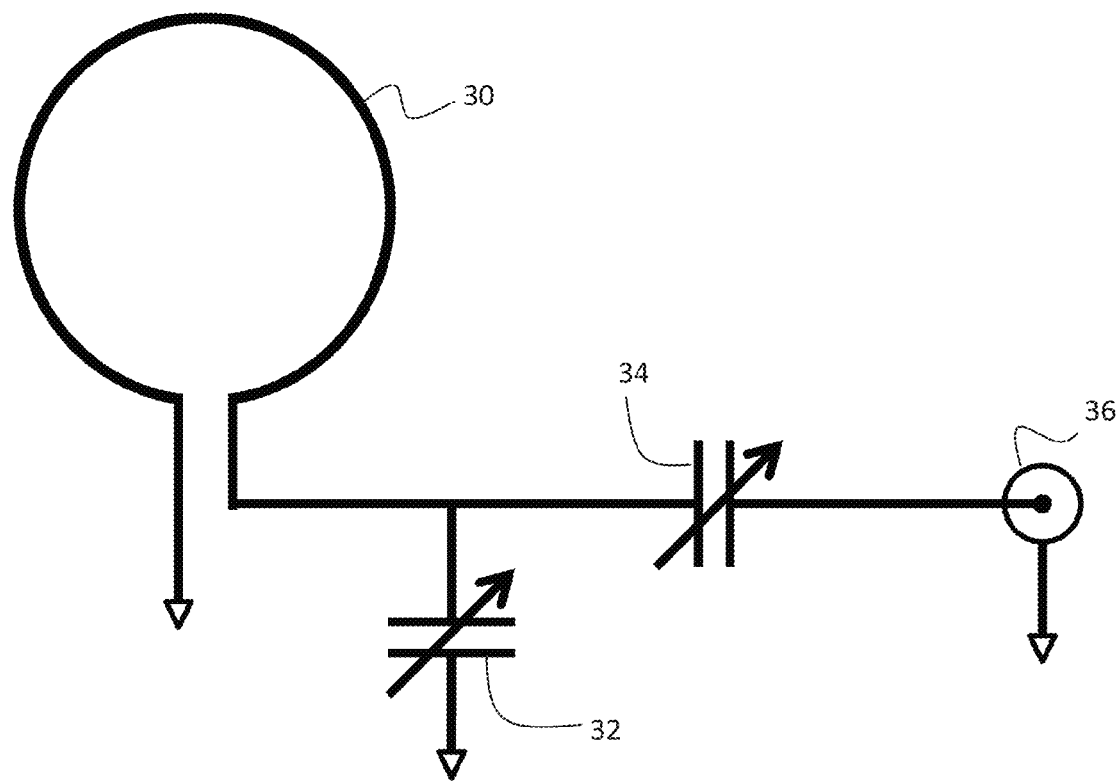
FIG. 4 is a mechanism for coupling electrical energy into and out of the self-resonant RF coils, according to an embodiment of the current invention.

FIG. 4 illustrates a mechanism according to an embodiment of the current invention for coupling electrical energy into and out of the self-resonant RF coils or HTS NMR coils. Single fixed loop 30 is positioned in the probe such that it is inductively coupled to the RF coils. Loop 30 would be positioned in proximity to the resonant coil. Single fixed loop 30 replaces the moving tuning and coupling loops for a coil pair in the conventional art. Thus, a network of trimmer capacitors 32, 34 are included to terminate loop 30. Trimmer capacitors 32, 34 are adjusted to vary both the coupling and the resonant frequency of the NMR coil. Adjusting trimmer capacitors 32, 34 does not affect the resolution of the probe, requiring re-shimming each time the tuning and coupling are adjusted. The parallel capacitor 32 can be varied to tune the frequency of the self-resonant coil. The series capacitor 34 can be adjusted to match the coil impedance to the impedance of the transmission line 36. Tuning rods (not seen) can be added to access the variable capacitors.

In order to allow for adjustments to tuning and matching, single loop 30 is in an over coupled condition to the NMR coil. This means that the impedance at the terminals of loop 30 looking toward the coil at the coil resonance frequency is less than the characteristic impedance of the transmission line. The amount of coupling needed can be predetermined and preset based on the inductance and quality factor of the NMR coil, the tuning range needed, and the anticipated loss in the NMR sample itself.

Further, electrical loss should be minimized in fixed coupling loop 30. This electrical loss can occur as a function of two processes. First, there may be electrical loss due to the desired currents induced along the length of coupling loop 30 needed for coupling and tuning. These loops increase proportionally with the series resistance of the wire. In the typical limit for RF circuits, where the wire thickness is much greater than the skin depth, the series resistance varies inversely with the wire radius. This transport loss is then inversely proportional to wire radius, so it would be desirable to use a wire of large radius. However, magnetic flux perpendicular to the finite surface area of the wire induces so-called eddy currents in the wire, also contributing to electrical loss. A wire of larger radius would be subject to greater eddy current loss. As such, there is an optimal wire radius which can be determined for each case. The location and shape of the fixed coupling loop can also be adjusted to maximize coupling while minimizing eddy current loss. Because loop 30 is fixed, the wire would remain in the configuration of minimum loss at all times.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

Glossary of Claim Terms

Capacitance: This term is used herein to refer to the ability of a body to store an electrical charge Capacitive coupling: This term is used herein to refer to the transfer of energy within an electric network by means of capacitance between circuit nodes.

Central conductor: This term is used herein to refer to an object or substance that allows heat, electricity, light or sound to pass along it or through it. Central means it is in or towards the center of the body.

Current-carrying elements: This term is used herein to refer to an aspect of an NMR RF coil that is structured for the flow of a current.

Dieletric substrate: This term is used herein to refer to electrical insulators, such as silicon, ceramic quartz, etc. It is selected with dielectric strength, dielectric constant and loss tailored for specific circuit application in order to serve as a base for another material. Generally, it is a nonconductor of electricity with electrical conductivity of less than a millionth ($10^{-6}$) of a siemens.

Magnetic flux: This term is used herein to refer to the component of the magnetic B field that passes through a surface. A lower magnetic flux corresponds to a lower interaction between magnetic fields generated by separate coils (i.e., the magnetic field generated by a coil is not passing through the surface of another coil).

Nuclear magnetic resonance: This term is used herein to refer to a physical phenomenon in which magnetic nuclei in a magnetic field absorb and re-emit electromagnetic radiation. The energy that is re-emitted is at a specific resonance frequency which depends on the strength of the magnetic field and magnetic properties of the isotope of the atoms.

Nuclear magnetic resonance probe: This term is used herein to refer to the portion of an NMR spectrometer responsible for a significant portion of the work. The probe is placed in the center of the magnetic field, and the sample is inserted into the center of the probe. The probe contains radiofrequency coils (RF) tuned at specific frequencies for specific nuclei.

Orthogonal: This term is used herein to refer to objects being perpendicular, non-overlapping, varying independently, or uncorrelated.

Parallel: This term is used herein to refer to two or more straight coplanar lines that do not intersect.

Perpendicular: This term is used herein to refer to two structures or aspects intersecting or forming a 90 degree (right) angle.

Radiofrequency coil: This term is used herein to refer to coils contained within the probe tuned at specific frequencies for specific nuclei.

Resonance: This term is used herein to refer to the tendency of a system to oscillate at varying amplitude at some frequency. The level of amplitude is greater at some frequencies than others.

What is claimed is:

1. A nuclear magnetic resonance probe, comprising:
a first radiofrequency coil patterned on a planar dielectric substrate, said first radiofrequency coil formed of conductive material, said first radiofrequency coil generating a first magnetic field that is resonant at a first radiofrequency;
a second radiofrequency coil patterned on said dielectric substrate, said second radiofrequency coil formed of conductive material, said second radiofrequency coil generating a second magnetic field that is resonant at a second radiofrequency,
said first radiofrequency coil and said second radiofrequency coil forming a first double-resonance apparatus;
a second double-resonance apparatus positioned substantially parallel to said first double-resonance apparatus; and
a sample region formed between said first double-resonance apparatus and said second double-resonance apparatus, said sample region configured to receive a nuclear magnetic resonance sample,
said first magnetic field of said first radiofrequency coil being substantially parallel to a plane of said dielectric substrate in said sample region,
said second magnetic field of said second radiofrequency coil being substantially perpendicular to said plane of said dielectric substrate in said sample region,
said first radiofrequency coil being substantially in the shape of a figure-eight and patterned on a side of said dielectric substrate that is proximal to said nuclear magnetic resonance sample,
said second radiofrequency coil being a spiral resonator and patterned on an opposite side of said dielectric substrate that is distal to said nuclear magnetic resonance sample,
wherein said first magnetic field and said second magnetic field excite or detect respective nuclear magnetic resonance signals at said first radiofrequency and said second radiofrequency alternately or simultaneously
wherein said second magnetic field is orthogonal to said first magnetic field at their respective resonant frequencies in said sample region.

2. A nuclear magnetic resonance probe as in claim 1, further comprising:
said first radiofrequency coil including a first set of current-carrying elements and said second radiofrequency coil including a second set of current-carrying elements,
said first set of current-carrying elements set at said first radiofrequency being exclusive of said second set of current-carrying elements set at said second radiofrequency.

3. A nuclear magnetic resonance probe as in claim 1, further comprising:
said first radiofrequency coil being a racetrack resonator.

4. A nuclear magnetic resonance probe as in claim 1, further comprising:
a Faraday shield positioned between said first and second radiofrequency coils, wherein said Faraday shield reduces an electric field generated by said second radiofrequency coil but does not affect said first magnetic field generated by said first radiofrequency coil.

5. A nuclear magnetic resonance probe as in claim 1, further comprising:
said dielectric substrate formed of two (2) substrates that are fastened together, and
said first and second radiofrequency coils patterned on said two (2) substrates, respectively.

6. A nuclear magnetic resonance probe as in claim 1, further comprising:
said first and second radiofrequency coils patterned on a single side of said dielectric substrate, wherein said first radiofrequency coil is positioned within said second radiofrequency coil.

7. A nuclear magnetic resonance probe as in claim 6, further comprising:
said first radiofrequency coil being a spiral resonator and said second radiofrequency coil being a spiral resonator.

8. A nuclear magnetic resonance probe as in claim 1, further comprising:
a central conductor patterned along a substantial center of said first radiofrequency coil and along a longitudinal axis of said first radiofrequency coil, wherein current in said probe at said first radiofrequency flows through said central conductor,
wherein said first and second radiofrequency coils carry current in counter directions on opposite sides of said nuclear magnetic resonance sample, such that said first and second magnetic fields in said sample region are additive and are generated substantially parallel to said dielectric substrate.

9. A nuclear magnetic resonance probe as in claim 8, further comprising:
said central conductor having two (2) end portions along said longitudinal axis of said first or second radiofrequency coil, said two (2) end portions defining a middle portion, said middle portion having a predetermined width, said two (2) ends being tapered relative to said middle portion in order to improve homogeneity of said first and second magnetic fields.

10. A nuclear magnetic resonance probe as in claim 1, further comprising:
a fixed inductive coupling loop used to transfer energy into and out of said first and second radiofrequency coils, said coupling loop terminated by a network of adjustable capacitors that are adjustable to achieve tuning and coupling of said first and second radiofrequency coils.

11. A nuclear magnetic resonance probe as in claim 10, further comprising:
said coupling loop formed of high temperature superconductors.

12. A method of minimizing interaction between two (2) coils positioned in close proximity to each other, comprising the steps of:

- patterning a first coil on a planar dielectric substrate, said first coil generating a first magnetic field resonant at a first frequency, said first magnetic field being substantially perpendicular to the plane of said dielectric substrate,
- patterning a second coil on said dielectric substrate, said second coil generating a second magnetic field resonant at a second frequency, said second magnetic field being substantially parallel to said plane of said dielectric substrate;
- patterning a central conductor in said first radiofrequency coil or said second radiofrequency coil, such that a current in said probe coil at said first or second frequency flows through said central conductor and generates said first or second magnetic fields, respectively, parallel to the plane of said dielectric substrate,
- said first and second radiofrequency coils defining a nuclear magnetic resonance probe coil;
- wherein a net magnetic flux generated by said first coil and flowing through said second coil is substantially zero (0).

* * * * *